United States Patent
Huang

(10) Patent No.: US 10,831,068 B2
(45) Date of Patent: Nov. 10, 2020

(54) LIFTING APPARATUS, ULTRAVIOLET IRRADIATION APPARATUS FOR ALIGNMENT, AND SUBSTRATE ALIGNMENT METHOD

(71) Applicants: HKC CORPORATION LIMITED, Guangdong (CN); CHONGQING HKC OPTOELECTRONICS TECHNOLOGY CO., LTD., Chongqing (CN)

(72) Inventor: Chun-Chin Huang, Chongqing (CN)

(73) Assignees: HKC CORPORATION LIMITED, Guangdong (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/312,477

(22) PCT Filed: Mar. 6, 2018

(86) PCT No.: PCT/CN2018/078121
§ 371 (c)(1),
(2) Date: Dec. 21, 2018

(87) PCT Pub. No.: WO2018/171420
PCT Pub. Date: Sep. 27, 2018

(65) Prior Publication Data
US 2020/0110317 A1    Apr. 9, 2020

(30) Foreign Application Priority Data

Mar. 23, 2017   (CN) .................... 2017 2 0289752 U

(51) Int. Cl.
*G02F 1/1337*    (2006.01)
*H01L 21/687*    (2006.01)

(52) U.S. Cl.
CPC .. *G02F 1/133788* (2013.01); *H01L 21/68742* (2013.01)

(58) Field of Classification Search
CPC ..................... G02F 1/133788; H01L 21/68742
See application file for complete search history.

(56) References Cited

U.S. PATENT DOCUMENTS 10,332,778 B2 *  6/2019  Pohl .................. H01L 21/68742
10,386,661 B2 *  8/2019  Xu ......................... G02F 1/1303
(Continued)

FOREIGN PATENT DOCUMENTS

CN       101295108 A     10/2008
CN       102085511 A     6/2011
(Continued)

OTHER PUBLICATIONS

International Search Report for PCT/CN2018/078121, dated Jun. 8, 2018.

*Primary Examiner* — Kaitlin S Joerger
(74) *Attorney, Agent, or Firm* — Seyfarth Shaw, LLP; Joseph Lanser

(57) ABSTRACT

A lifting apparatus, ultraviolet irradiation apparatus for alignment, and substrate alignment method. The lifting apparatus comprises: a support plate, provided with multiple lifting rods passing therethrough, each lifting rod being provided with at least one through hole (13) through which a respective lifting rod passes and extends along a vertical direction; an air producing mechanism, in communication with each through hole (13); and a transmission mechanism, disposed at the lower end of the lifting rods.

12 Claims, 3 Drawing Sheets

(56) References Cited

U.S. PATENT DOCUMENTS

| | | | |
|---|---|---|---|
| 2010/0212594 A1* | 8/2010 | Hara | C23C 16/4401 118/725 |
| 2011/0042906 A1* | 2/2011 | Aichholzer | H01L 21/68742 279/155 |
| 2011/0315080 A1* | 12/2011 | Choi | H01L 21/68742 118/723 E |
| 2012/0124857 A1 | 5/2012 | He et al. | |
| 2012/0313308 A1* | 12/2012 | Yan | B25B 11/005 269/21 |
| 2013/0189847 A1* | 7/2013 | Tezuka | H01J 37/32431 438/710 |
| 2013/0319615 A1* | 12/2013 | Cho | B08B 5/00 156/345.29 |
| 2014/0144584 A1* | 5/2014 | Koo | H01J 37/3211 156/345.48 |
| 2014/0216332 A1* | 8/2014 | Omori | C23C 16/4586 118/50 |
| 2014/0265097 A1* | 9/2014 | Cuvalci | B25B 11/00 269/53 |
| 2015/0153105 A1 | 6/2015 | Yu et al. | |
| 2016/0268157 A1* | 9/2016 | Gong | G02F 1/1303 |
| 2017/0198395 A1* | 7/2017 | Nozawa | H01L 21/3065 |
| 2017/0221720 A1* | 8/2017 | Cho | B08B 5/00 |
| 2017/0365449 A1* | 12/2017 | Cui | C23C 16/4586 |
| 2018/0016677 A1* | 1/2018 | Roy | C23C 16/463 |
| 2018/0050368 A1* | 2/2018 | Harumoto | G03F 7/0002 |
| 2018/0135172 A1* | 5/2018 | Nogami | C30B 25/12 |
| 2018/0182649 A1* | 6/2018 | Inoue | H01L 21/68742 |
| 2018/0223424 A1* | 8/2018 | Kim | C23C 16/4401 |
| 2018/0230599 A1* | 8/2018 | Tanaka | C23C 16/4408 |
| 2018/0231894 A1* | 8/2018 | Fukumoto | G03F 7/40 |
| 2018/0269084 A1* | 9/2018 | Fukumoto | H01L 21/67126 |
| 2019/0006208 A1* | 1/2019 | Maki | G06N 5/045 |
| 2019/0027394 A1* | 1/2019 | Sarode Vishwanath | H01L 21/68785 |
| 2019/0035671 A1* | 1/2019 | Ha | H01L 21/68735 |
| 2019/0043698 A1* | 2/2019 | Parkhe | H01L 21/67383 |
| 2019/0088518 A1* | 3/2019 | Koh | H01L 21/6833 |
| 2019/0153603 A1* | 5/2019 | Yadav | C23C 16/463 |
| 2019/0157130 A1* | 5/2019 | Lee | H01J 37/32733 |
| 2019/0189492 A1* | 6/2019 | Parkhe | H01L 21/67109 |
| 2019/0287844 A1* | 9/2019 | Matsuura | H01L 21/68742 |
| 2019/0355597 A1* | 11/2019 | Mochizuki | C23C 16/52 |
| 2019/0360100 A1* | 11/2019 | Nguyen | H01J 37/32834 |
| 2019/0371572 A1* | 12/2019 | Wakabayashi | H01J 37/32449 |

FOREIGN PATENT DOCUMENTS

| | | |
|---|---|---|
| CN | 103454810 A | 12/2013 |
| CN | 103529599 A | 1/2014 |
| CN | 204453794 U | 7/2015 |
| CN | 206573826 U | 10/2017 |
| WO | 2016157619 A1 | 10/2016 |

* cited by examiner

LIFTING APPARATUS, ULTRAVIOLET IRRADIATION APPARATUS FOR ALIGNMENT, AND SUBSTRATE ALIGNMENT METHOD

CROSS REFERENCE TO RELATED APPLICATIONS

This is a National Stage application of, and claims priority to, PCT/CN2018/078121, filed Mar. 6, 2018, which claims priority to CN Patent Application No. 201720289752.3, filed Mar. 23, 2017, the disclosures of which are incorporated herein by reference in their entirety.

TECHNICAL FIELD

The present disclosure relates to the field of device production and processing technologies, and for example, relates to a lifting apparatus, an aligning ultraviolet irradiation machine applying same, and an alignment method for a substrate.

BACKGROUND

Liquid crystal displays firmly occupy a dominant place in the display field due to good quality such as lightness, thinness, and low power consumption. According to photoalignment in a liquid crystal technology, linearly polarized ultraviolet light is used to irradiate a high molecular polymer alignment film having photoperceptivity, so that a high molecular polymer has an alignment capability. Advantages of the photoalignment are that surface contamination of a glass substrate possibly caused in a contact and rubbing alignment process is avoided, and an alignment area is slightly limited. Therefore, multi-domain alignment may be implemented by using a mask, and a parameter of a liquid crystal cell is controlled by using an angle of incident light and an irradiation time. A photoalignment agent is a polymer, and is formed through bonding of many monomers. The monomers are mutually bonded through irradiation to form a macromolecule. In liquid crystal alignment, to enable liquid crystal molecules to be arranged in a direction of arranging aligned molecules, selected monomers are bonded to form a molecule with a long bond length.

An aligning ultraviolet irradiation machine performs sheet feeding and sheet removal actions by using a mechanical arm. During the sheet feeding, a lifting pin of the aligning ultraviolet irradiation machine is raised so that an upper surface of the lifting pin is higher than an upper surface of an alignment mechanism, and the mechanical arm sends a substrate to the upper surface of the lifting pin of the aligning ultraviolet irradiation machine. After the sheet feeding is completed, the lifting pin is lowered by a particular distance, and alignment is completed on the lifting pin by using the alignment mechanism for the substrate. Because a material of the upper surface of the lifting pin that comes into contact with the substrate needs to be antistatic, a friction coefficient is relatively large. In addition, a relatively large weight of the substrate leads to a relatively large contact friction force between the upper surface of the lifting pin and the substrate. If a sheet feeding position of the mechanical arm is skewed seriously, a substrate placement position needs to be greatly adjusted by the alignment mechanism. Further, a relatively large push force of the alignment mechanism on the substrate is generated. Therefore, due to the large contact friction force between the substrate and the upper surface of the lifting pin, the substrate is prone to be crushed in a process of pushing the substrate by the alignment mechanism.

SUMMARY

The present disclosure provides a lifting apparatus. When an alignment action is performed, high-pressure gas is introduced into a through hole provided on a lifting pin, to blow up a substrate on an upper surface of the lifting apparatus. This reduces a friction force between the upper surface of the lifting apparatus and the substrate, and helps an alignment mechanism push the substrate, thereby avoiding fragmentation of the substrate.

A lifting apparatus, including:

a supporting plate, where the supporting plate is sleeved over a plurality of lifting pins, and each lifting pin is provided with at least one through hole running through the corresponding lifting pin and extending along a vertical direction;

a gas producing mechanism, where the gas producing mechanism communicates with each through hole; and a transmission mechanism, where the transmission mechanism is arranged at a lower end of the lifting pin.

Optionally, the gas producing mechanism is a clean and dry compressed air system, and the clean and dry compressed air system includes an air compressor, a solenoid valve, and a pressure regulator.

Optionally, the supporting plate includes:

a first supporting plate, where the first supporting plate is provided with a slide hole fitting with the lifting pin, and the lifting pin is slidably sleeved in the slide hole; and a second supporting plate, where the second supporting plate is arranged below the first supporting plate, and the lower end of the lifting pin is fixed in the second supporting plate; and the lifting apparatus further includes a displacement transmission mechanism arranged below the second supporting plate.

Optionally, the displacement transmission mechanism includes a hydraulic cylinder, a robo cylinder, or an air cylinder.

Optionally, the lifting apparatus further includes a plurality of alignment mechanisms arranged on side faces of the first supporting plate and the second supporting plate.

Optionally, the alignment mechanism is cylindrical.

Optionally, an upper surface and a lower surface of the first supporting plate and an upper surface and a lower surface of the second supporting plate are all rectangles whose corresponding edges are equal, the lifting pins include first lifting pins, the first lifting pins penetrate through four edges of the first supporting plate, and the first lifting pin is a cuboid.

Optionally, the lifting pins further include second lifting pins, the second lifting pins penetrate through a portion surrounded by the four edges, the second lifting pin is a cylinder, and a slide hole fitting with the second lifting pin is a through hole.

Optionally, the lifting pins further include second lifting pins, the second lifting pins penetrate through a portion surrounded by the four edges, the second lifting pin is a concentric stepped stud, and a slide hole fitting with the second lifting pin is a stepped hole.

Optionally, the lifting apparatus further includes a plurality of alignment mechanisms arranged on side faces of the first supporting plate and the second supporting plate.

Optionally, the alignment mechanism is cylindrical.

Optionally, upper surfaces and lower surfaces of the first supporting plate and the second supporting plate are rectangles, the lifting pins include first lifting pins, the first lifting pins penetrate through four edges of the first supporting plate, and the first lifting pin is a cuboid.

Optionally, the lifting pins further include second lifting pins, the second lifting pins penetrate through a portion surrounded by the four edges, the second lifting pin is a cylinder, and a slide hole fitting with the second lifting pin is a through hole.

Optionally, the lifting pins further include second lifting pins, the second lifting pins penetrate through a portion surrounded by the four edges, the second lifting pin is a concentric stepped stud, and a slide hole fitting with the second lifting pin is a stepped hole.

Optionally, upper surfaces and lower surfaces of the first supporting plate and the second supporting plate are rectangles, and a projection of the first supporting plate on a horizontal plane exactly overlaps a projection of the second supporting plate on the horizontal plane.

Optionally, the plurality of alignment mechanisms is separately arranged at two ends of each edge of the first supporting plate.

An embodiment further provides an aligning ultraviolet irradiation machine, including a lifting apparatus and an ultraviolet lamp, where the lifting apparatus includes:

a supporting plate, where the supporting plate is sleeved over a plurality of lifting pins, and each lifting pin is provided with at least one through hole running through the corresponding lifting pin and extending along a vertical direction;

a gas producing mechanism, where the gas producing mechanism communicates with each through hole; and a transmission mechanism, where the transmission mechanism is arranged at a lower end of the lifting pin; and the ultraviolet lamp is arranged above the supporting plate, and is configured to irradiate a substrate placed on the supporting plate.

Optionally, the aligning ultraviolet irradiation machine further includes an auxiliary reflection plate, arranged on a side face of the ultraviolet lamp and configured to reflect ultraviolet light emitted by the ultraviolet lamp, to improve utilization of the ultraviolet light.

An embodiment further provides an alignment method for a substrate, including:

raising a lifting pin when a mechanical arm delivers a substrate;

placing, by the mechanical arm, the substrate on an upper surface of the lifting pin;

lowering the lifting pin by a preset distance after delivery of the substrate is completed;

starting a solenoid valve so that gas having pressure greater than a preset threshold is introduced into a through hole to provide an upward force for the substrate, to reduce a friction force between the upper surface of the lifting pin and the substrate; and pushing the substrate by using an alignment mechanism to complete an alignment action, where the alignment method adopts a lifting apparatus, and the lifting apparatus includes:

a supporting plate, where the supporting plate is sleeved over a plurality of lifting pins, and each lifting pin is provided with at least one through hole running through the corresponding lifting pin and extending along a vertical direction;

a gas producing mechanism, where the gas producing mechanism communicates with each through hole; and a transmission mechanism, where the transmission mechanism is arranged at a lower end of the lifting pin.

Optionally, the lifting apparatus further includes a displacement transmission mechanism, where the raising a lifting pin includes: pushing, by the displacement transmission mechanism, a second supporting plate upward, to push the lifting pin to be raised; and the lowering the lifting pin by a preset distance includes: pulling, by the displacement transmission mechanism, the second supporting plate downward, to pull the lifting pin to be lowered by the preset distance.

The present disclosure can reduce the friction force between the upper surface of the lifting apparatus and the substrate, and help the alignment mechanism push the substrate, thereby avoiding fragmentation of the substrate.

DETAILED DESCRIPTION OF THE EMBODIMENTS

Figure 1:
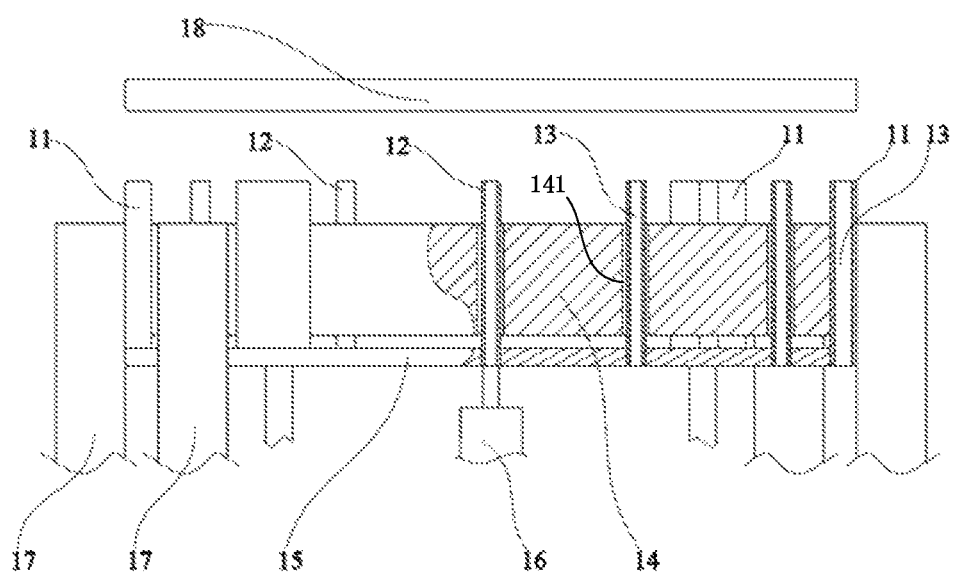
FIG. 1 is a partial exploded view of a lifting apparatus and a substrate according to an embodiment.
Figure 2:
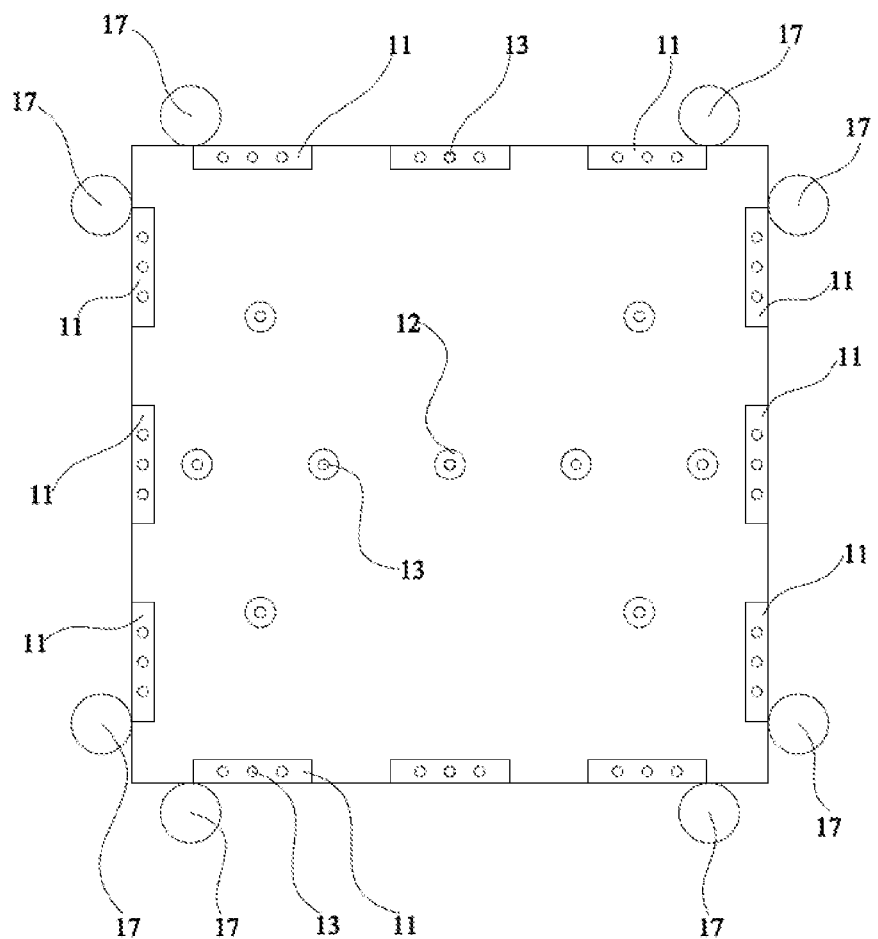
FIG. 2 is a top view of a lifting apparatus according to an embodiment.

As shown in FIG. 1 and FIG. 2, an embodiment provides a lifting apparatus, including a supporting plate. The supporting plate is sleeved over a plurality of lifting pins, and each lifting pin is provided with at least one through hole 13 running through the lifting pin along a vertical direction. Each through hole 13 is connected to a gas producing mechanism, and a transmission mechanism is arranged at a lower end of the lifting pin. The transmission mechanism can ensure that high-pressure gas is introduced into the through hole 13 while an alignment action is performed, to blow up a substrate 18 on an upper surface of the lifting apparatus. This reduces a friction force between the upper surface of the lifting apparatus and the substrate 18, and helps an alignment mechanism 17 push the substrate 18, thereby avoiding fragmentation of the substrate 18.

In one embodiment, the gas producing mechanism is a clean and dry compressed air system, and the clean and dry compressed air system includes an air compressor, a solenoid valve, and a pressure regulator. The solenoid valve may be arranged to control emission of the high-pressure gas: When a mechanical arm performs sheet feeding (that is, delivers the substrate), the lifting pin is raised. The mechanical arm places the substrate 18 on an upper surface of the lifting pin. In this case, the solenoid valve is in a ventilation closed state, and no high-pressure gas is introduced into the through hole 13. After the sheet feeding is completed, the lifting pin is lowered by a preset distance, the substrate 18 is located on the upper surface of the lifting pin, and an alignment action is completed by using the alignment mechanism 17. In a process of performing the alignment action, when the solenoid valve is in a state of enabling the high-pressure gas to be introduced into the through hole 13, an upward force can be provided for the substrate 18, to reduce a friction force between the upper surface of the lifting pin and the substrate 18, and help the alignment mechanism 17 push the substrate 18, thereby avoiding fragmentation of the substrate 18. The pressure regulator may be arranged to adjust an amount of emitted high-pressure gas, so as to select high-pressure gas with different emission amounts for substrates 18 with different weights. This is convenient, flexible and targeted in use and provides appropriate gas buoyancy. Optionally, the upward force provided for the substrate 18 may be used to blow up the substrate 18. For example, in this embodiment and other embodiments, the high pressure may be pressure in a range of 0.5 Mpa to 0.7 Mpa.

In one embodiment, the supporting plate is divided into a first supporting plate 14 and a second supporting plate 15. The first supporting plate 14 is provided with a slide hole 141 fitting with the lifting pin. The lifting pin is slidably sleeved in the slide hole 141. The second supporting plate 15 is arranged below the first supporting plate 14, and the lower end of the lifting pin is fixed in the second supporting plate 15. A displacement transmission mechanism 16 is arranged below the second supporting plate 15, and the displacement transmission mechanism 16 is a hydraulic cylinder or an air cylinder. According to such a structural design, the lifting pin can be raised and lowered. When the lifting pin needs to be raised, the displacement transmission mechanism 16 pushes the second supporting plate 15 upward. When the lifting pin needs to be lowered, the displacement transmission mechanism 16 pulls the second supporting plate 15 downward. Because the lifting pin is slidably sleeved in the first supporting plate 14, wear between the lifting pin and the first supporting plate 14 caused by upward and downward moving the lifting pin can be avoided, thereby prolonging service lives of the lifting pin and the first supporting plate 14.

A plurality of alignment mechanisms 17 is adjacently arranged on side faces of the first supporting plate 14 and the second supporting plate 15. When a sheet feeding position of the mechanical arm is skewed, a position of the substrate 18 is corrected through cooperation of lowering of the lifting pin and side blocking of the peripheral alignment mechanisms 17. In one embodiment, the alignment mechanism 17 is cylindrical. In this way, an impact force of contact between a side face of the substrate 18 and a side face of the alignment mechanism 17 is relatively small, thereby avoiding damaging the side face of the substrate 18.

Optionally, based on the foregoing embodiment, the plurality of alignment mechanisms 17 is separately arranged at two ends of each edge of the first supporting plate 14.

In one embodiment, an upper surface and a lower surface of the first supporting plate 14 and an upper surface and a lower surface of the second supporting plate 15 are all rectangles whose corresponding edges are equal. First lifting pins 11 are sleeved in four edges of the first supporting plate 14, and the first lifting pin 11 is a cuboid. Because the four edges of the first supporting plate 14 are straight lines, a force of supporting the substrate 18 can be increased and inclination of the substrate 18 in the vertical direction can be reduced by arranging the rectangular-parallelepiped first lifting pins 11. Optionally, a portion far from the four edges of the first supporting plate 14 is further sleeved over second lifting pins 12. The second lifting pin 12 is a cylinder, and a slide hole fitting with the second lifting pin 12 is a through hole. The second lifting pin 12 is set to be a cylinder, and the slide hole fitting with the cylinder is set to be a through hole. This is convenient in processing and improves the efficiency of producing the lifting apparatus.

An upper surface and a lower surface of the first supporting plate 14 and an upper surface and a lower surface of the second supporting plate 15 are all rectangles whose corresponding edges are equal. First lifting pins 11 are sleeved in four edges of the first supporting plate 14, and the first lifting pin 11 is a cuboid. A portion far from the four edges of the first supporting plate 14 is further sleeved over second lifting pins 12. The second lifting pin 12 is a concentric stepped stud, and a slide hole fitting with the second lifting pin 12 is a stepped hole. Setting the second lifting pin 12 to be a concentric stepped stud helps improve support of the substrate 18, and setting the slide hole fitting with the concentric stepped stud to be a stepped hole can facilitate placement of the concentric stepped stud. Optionally, an upper surface and a lower surface of the first supporting plate 14 and an upper surface and a lower surface of the second supporting plate 15 are rectangles, and a projection of the first supporting plate 14 on a horizontal plane exactly overlaps a projection of the second supporting plate 15 on the horizontal plane.

Optionally, a material of the lifting pin is polyetheretherketone or silica gel. The polyetheretherketone and the silica gel provide superior electrical insulation, which can effectively prevent static electricity from damaging the substrate 18.

According to the lifting apparatus provided in this embodiment, each lifting pin of the lifting apparatus is provided with the at least one through hole running through the lifting pin along the vertical direction. Each through hole is connected to the gas producing mechanism. When an alignment action is performed, gas having preset pressure is introduced into the through hole, to provide the upward force for the substrate on the upper surface of the lifting apparatus, and even enable the substrate to be in a to-be-blown-up state. This can reduce the friction force between the upper surface of the lifting apparatus and the substrate, and help the alignment mechanism push the substrate, thereby avoiding damaging the substrate.

Figure 3:
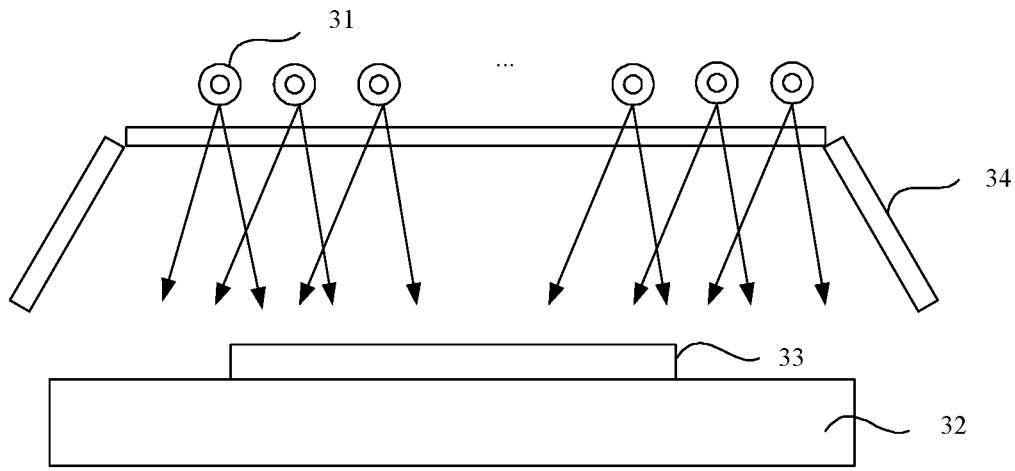
FIG. 3 is a schematic structural diagram of an aligning ultraviolet irradiation machine according to an embodiment.

FIG. 3 is a schematic structural diagram of an aligning ultraviolet irradiation machine according to an embodiment. Referring to FIG. 3, the aligning ultraviolet irradiation machine applied the foregoing lifting apparatus provided in this embodiment includes a lifting apparatus (FIG. 3 shows only a supporting plate 32 of the lifting apparatus) and an ultraviolet lamp 31.

The lifting apparatus includes:

the supporting plate 32, where the supporting plate 32 is sleeved over a plurality of lifting pins, and each lifting pin is provided with at least one through hole running through the corresponding lifting pin and extending along a vertical direction;

a gas producing mechanism, where the gas producing mechanism communicates with each through hole; and a transmission mechanism, where the transmission mechanism is arranged at a lower end of the lifting pin.

The ultraviolet lamp 31 is arranged above the supporting plate, and is configured to irradiate a substrate 33 placed on the supporting plate 32.

Optionally, the aligning ultraviolet irradiation machine provided in this embodiment may further include an auxiliary reflection plate 34 arranged on a side face of the ultraviolet lamp. The auxiliary reflection plate 34 is configured to reflect ultraviolet light emitted by the ultraviolet lamp, to improve utilization of the ultraviolet light.

The aligning ultraviolet irradiation machine provided in this embodiment adopts the lifting apparatus described in the foregoing embodiment, provides an upward force for the substrate on an upper surface of the lifting apparatus, and enables the substrate to be in a to-be-blown-up state. This can reduce a friction force between the upper surface of the lifting apparatus and the substrate, and help an alignment mechanism push the substrate, thereby avoiding fragmentation of the substrate.

Figure 4:
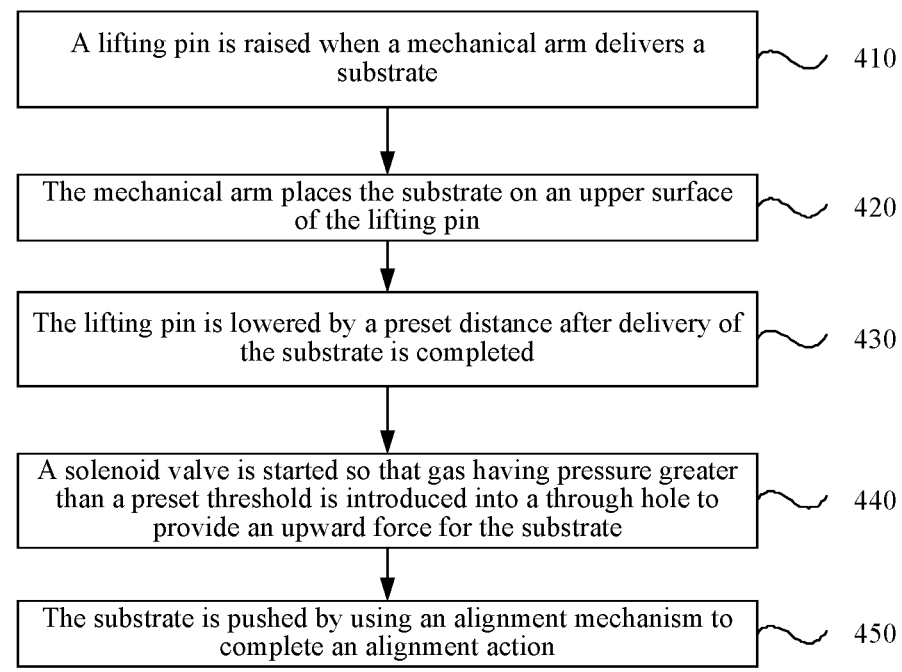
FIG. 4 is a schematic flowchart of an alignment method for a substrate according to an embodiment.

FIG. 4 is a schematic flowchart of an alignment method for a substrate according to an embodiment. Referring to FIG. 4, the alignment method for a substrate provided in this embodiment may be performed by the lifting apparatus in the foregoing embodiment, and include the following steps:

Step 410. A lifting pin is raised when a mechanical arm delivers a substrate.

Step 420. The mechanical arm places the substrate on an upper surface of the lifting pin. In this case, a solenoid valve is in a closed state.

Step 430. The lifting pin is lowered by a preset distance after delivery of the substrate is completed.

Step 440. The solenoid valve is started so that gas having pressure greater than a preset threshold is introduced into the through hole to provide an upward force for the substrate, to reduce a friction force between the upper surface of the lifting pin and the substrate.

Step 450. The substrate is pushed by using an alignment mechanism to complete an alignment action.

The alignment method may adopt the lifting apparatus in the foregoing embodiment, and the lifting apparatus may include:

a supporting plate, where the supporting plate is sleeved over a plurality of lifting pins, and each lifting pin is provided with at least one through hole running through the corresponding lifting pin and extending along a vertical direction;

a gas producing mechanism, where the gas producing mechanism communicates with each through hole; and a transmission mechanism, where the transmission mechanism is arranged at a lower end of the lifting pin.

In one embodiment, the lifting apparatus adopted in the alignment method for a substrate further includes a displacement transmission mechanism. In the alignment method for a substrate, the raising a lifting pin may include: pushing, by the displacement transmission mechanism, a second supporting plate upward, to push the lifting pin to be raised. The lowering the lifting pin by a preset distance may include: pulling, by the displacement transmission mechanism, the second supporting plate downward, to pull the lifting pin to be lowered by the preset distance.

The alignment method for a substrate provided in this embodiment adopts the lifting apparatus in the foregoing embodiment, provides the upward force for the substrate on the upper surface of the lifting apparatus, and enables the substrate to be in a to-be-blown-up state. This can reduce a friction force between the upper surface of the lifting apparatus and the substrate, and help the alignment mechanism push the substrate, thereby avoiding damaging the substrate in an alignment process.

What is claimed is:

1. A lifting apparatus, comprising:
a first supporting plate slidably coupled to first and second lifting pins, wherein the first supporting plate includes a slide hole adapted to slidably couple with the second lifting pin, and wherein a through hole is disposed in each of the first and second lifting pins and extends in an axial direction of the respective lifting pins, and;
a second supporting plate fixedly coupled to the first and second lifting pins;
a gas producing mechanism adapted to operably communicate with the through hole;
transmission mechanism respectively disposed at an end of each of the first and second lifting pins;
a displacement transmission mechanism disposed adjacent to the second supporting plate; and
alignment mechanisms disposed adjacent to respective side faces of the first and second supporting plates.

2. The lifting apparatus according to claim 1, wherein the gas producing mechanism is a clean and dry compressed air system that includes an air compressor, a solenoid valve, and a pressure regulator.

3. The lifting apparatus according to claim 1, wherein the displacement transmission mechanism comprises a hydraulic cylinder, a robo cylinder, or an air cylinder.

4. The lifting apparatus according to claim 1, wherein the alignment mechanism is cylindrical.

5. The lifting apparatus according to claim 1, wherein an upper surface and a lower surface of the first supporting plate and an upper surface and a lower surface of the second supporting plate are each a rectangular shape of substantially equal size and wherein the first lifting pin is a cuboid that is adapted to penetrate through an edge of the first supporting plate.

6. The lifting apparatus according to claim 5, wherein the second lifting pin is a cylinder that is adapted to penetrate a portion of the first supporting plate via the slide hole, and wherein the slide hole is a through hole.

7. The lifting apparatus according to claim 4, wherein an upper surface and a lower surface of the first supporting plate and an upper surface and a lower surface of the second supporting plate are each a rectangular shape, and wherein a first projection of the first supporting plate on a horizontal plane exactly overlaps a second projection of the second supporting plate on the horizontal plane.

8. The lifting apparatus according to claim 7, wherein the alignment mechanisms are respectively disposed at opposing ends of each edge of the first supporting plate.

9. An aligning ultraviolet irradiation machine, comprising including a lifting apparatus and an ultraviolet lamp, wherein the lifting apparatus comprises:
a first supporting plate slidably coupled to first and second lifting pins, wherein the first supporting plate includes a slide hole adapted to slidably couple with the second lifting pin, and wherein each of the first and second lifting pins includes a through hole extending along an axial direction;
a second supporting plate fixedly coupled to the first and second lifting pins;
a gas producing mechanism adapted to communicate with the through hole;
transmission mechanism respectively disposed at an end of each of the first and second lifting pins;
a displacement transmission mechanism disposed adjacent to the second supporting plate; and
alignment mechanisms disposed adjacent to respective side faces of the first and second supporting plates,
wherein the ultraviolet lamp is disposed adjacent to the first supporting plate, and is configured to irradiate a substrate placed on the first supporting plate.

10. The irradiation machine according to claim 9, further comprising an auxiliary reflection plate disposed adjacent to a side face of the ultraviolet lamp and adapted to reflect ultraviolet light emitted by the ultraviolet lamp to improve utilization of the ultraviolet light.

11. An alignment method for a substrate, comprising:
raising lifting pins when a mechanical arm delivers a substrate, wherein each lifting pin includes a through hole extending along an axial direction;

placing, by the mechanical arm, the substrate on the lifting pins;

lowering the lifting pins a preset distance;

starting a solenoid valve so that gas having pressure greater than a preset threshold is introduced into the through hole to apply a force to the substrate to reduce a friction force between the lifting pins and the substrate; and pushing the substrate to complete an alignment action using a lifting apparatus, and the lifting apparatus comprises:

a first supporting plate slidably coupled to the lifting pins;

a second supporting plate fixedly coupled to the lifting pins;

a gas producing mechanism adapted to operably communicate with the through hole;

transmission mechanism respectively disposed at an end of each of the lifting pins;

a displacement transmission mechanism disposed adjacent to the second supporting plate; and alignment mechanisms disposed adjacent to respective side faces of the first and second supporting plates.

12. The method according to claim 11, wherein the step of raising lifting pins includes:

pushing, by the displacement transmission mechanism, the second supporting plate towards the first supporting plate, and wherein the step of lowering the lifting pins by a preset distance includes pulling, by the displacement transmission mechanism, the second supporting plate away from the first supporting plate.

\* \* \* \* \*